United States Patent
Hynecek (10) Patent No.: US 10,957,724 B2
(45) Date of Patent: Mar. 23, 2021

(54) SINGLE-PHOTON AVALANCHE DIODE IMAGE SENSOR WITH PHOTON COUNTING AND TIME-OF-FLIGHT DETECTION CAPABILITIES

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 95 days.

(21) Appl. No.: 16/387,971

(22) Filed: Apr. 18, 2019

(65) Prior Publication Data

US 2019/0244986 A1 Aug. 8, 2019

Related U.S. Application Data

(63) Continuation of application No. 15/496,915, filed on Apr. 25, 2017, now Pat. No. 10,312,275.

(51) Int. Cl.
*H01L 31/107* (2006.01)
*H01L 27/146* (2006.01)
(Continued)

(52) U.S. Cl.
CPC .......... *H01L 27/146* (2013.01); *G01S 7/4813* (2013.01); *G01S 7/4816* (2013.01); *G01S 7/4863* (2013.01); *G01S 7/4865* (2013.01); *G01S 17/10* (2013.01); *G01S 17/86* (2020.01); *H01L 27/32* (2013.01); *H01L 29/08* (2013.01);
(Continued)

(58) Field of Classification Search
CPC ............ H01L 31/107; G01J 2001/4466; G01S 7/4861; G01T 1/248; G04F 10/005
See application file for complete search history.

(56) References Cited

U.S. PATENT DOCUMENTS

2006/0202129 A1 9/2006 Niclass et al.
2011/0285981 A1 11/2011 Justice et al.
(Continued)

OTHER PUBLICATIONS

Pancheri et al., "SPAD Image Sensor With Analog Counting Pixel for Time-Resolved Fluorescence Detection", Oct. 2013, IEEE Transactions on Electron Devices, vol. 60, No. 10, pp. 3442-3449. (Year: 2013).*

*Primary Examiner* — Thanh Luu
(74) *Attorney, Agent, or Firm* — Treyz Law Group, P.C.; Joseph F. Guihan (57) ABSTRACT

A back side illuminated image sensor may operate using the single-photon avalanche diode (SPAD) concept in a Geiger mode of operation for single photon detection. The image sensor may be implemented using two layer stacking with a silicon on insulator (SOI) chip. The chip-to-chip electrical connections between the top level image sensing chip and the second level ASIC circuit chip may be realized at each pixel with a single bump connection per pixel. A light level signal may be obtained from pixels that have photon counting capabilities while a distance measurement signal for 3-dimensional imaging may be obtained from pixels that have time-of-flight (ToF) detection capabilities. Both types of pixels may be integrated within the same array and use the same SPAD structure placed on the top chip.

5 Claims, 5 Drawing Sheets (51) Int. Cl.
*H01L 31/02* (2006.01)
*H01L 27/32* (2006.01)
*G01S 17/10* (2020.01)
*G01S 7/481* (2006.01)
*G01S 7/4863* (2020.01)
*G01S 7/4865* (2020.01)
*G01S 17/86* (2020.01)
*H01L 29/08* (2006.01)
*G01J 1/44* (2006.01)
*H03K 21/00* (2006.01)

(52) U.S. Cl.
CPC ...... *H01L 31/02027* (2013.01); *H01L 31/107* (2013.01); *G01J 1/44* (2013.01); *G01J 2001/442* (2013.01); *H01L 31/02019* (2013.01); *H03K 21/00* (2013.01)

(56) References Cited

U.S. PATENT DOCUMENTS

| | | | |
|---|---|---|---|
| 2013/0168535 A1* | 7/2013 | Eldesouki | H01L 31/107 250/214.1 |
| 2013/0248689 A1* | 9/2013 | Eldesouki | G01J 1/46 250/208.1 |
| 2014/0124652 A1* | 5/2014 | Dutton | H01L 27/14601 250/208.1 |
| 2015/0115131 A1 | 4/2015 | Webster et al. | |
| 2015/0200314 A1 | 7/2015 | Webster | |
| 2016/0223397 A1 | 8/2016 | Tsai et al. | |
| 2016/0240579 A1 | 8/2016 | Sun et al. | |
| 2017/0186798 A1 | 6/2017 | Yang et al. | |
| 2017/0187939 A1* | 6/2017 | Kasuga | G01J 1/44 |
| 2018/0081040 A1* | 3/2018 | Kubota | G01S 7/4865 |
| 2018/0115762 A1* | 4/2018 | Bulteel | G01S 7/4865 |

* cited by examiner

SINGLE-PHOTON AVALANCHE DIODE IMAGE SENSOR WITH PHOTON COUNTING AND TIME-OF-FLIGHT DETECTION CAPABILITIES

This application is a continuation of U.S. patent application Ser. No. 15/496,915, filed Apr. 25, 2017, which is hereby incorporated by reference herein in its entirety. This application claims the benefit of and claims priority to U.S. patent application Ser. No. 15/496,915, filed Apr. 25, 2017.

BACKGROUND

This relates generally to imaging systems and, more particularly, to photon counting complementary metal-oxide-semiconductor (CMOS) image sensor arrays with pixels that use single-photon avalanche diodes (SPADs) for single photon detection and that are illuminated from the back side of the substrate.

Modern electronic devices such as cellular telephones, cameras, and computers often use digital image sensors. Image sensors (sometimes referred to as imagers) may be formed from a two-dimensional array of image sensing pixels. Each pixel includes a photosensitive element that receives incident photons (light) and converts the photons into electrical signals. Image sensors are sometimes designed to provide images to electronic devices using a Joint Photographic Experts Group (JPEG) format.

Conventional image sensors with back side illuminated pixels may suffer from limited functionality in a variety of ways. For example, some conventional image sensors may not be able to determine the distance from the image sensor to the objects that are being imaged. Conventional image sensors may also have lower than desired image quality and resolution.

It would therefore be desirable to be able to provide improved image sensors with back side illuminated pixels.

DETAILED DESCRIPTION

The following relates to solid-state image sensor arrays, specifically to photon counting CMOS image sensor arrays with pixels that use single-photon avalanche diodes (SPADs) for single photon detection and that are illuminated from the back side of the substrate. To further improve performance of these types of sensors, hybrid chip stacking technology and silicon on insulator (SOI) technology may be used. SPAD pixel active area and corresponding quantum efficiency may be increased by moving some of the pixel circuits from the top light sensing chip to an underlying application-specific integrated circuit (ASIC) chip. The SOI technology allows for reduction of circuit parasitic capacitances which results in lower power consumption and an increased SPAD sensitivity.

An improved CMOS sensor array may include both a first set of SPAD pixels that use photon counting to determine the pixel illumination levels and a second set of SPAD pixels that measure the photon time-of-flight (ToF). The ToF is measured by tracking the length of time for a pulse of a light source (e.g., an infrared laser) to reach the viewing objects and be reflected back to the sensor. The time-of-flight may thereby determine the distance from the camera to the objects. This concept of including SPAD pixels for both determining pixel illumination levels and determining time-of-flight thus allows forming a high quality and a high resolution 3-dimensional image of the scene using only one CMOS image sensor.

Some image sensors sense light by converting impinging photons into electrons or holes that are integrated (collected) in pixel photodiodes within the sensor array. After completion of an integration cycle, collected charge is converted into a voltage, which is supplied to the output terminals of the sensor. In CMOS image sensors the charge to voltage conversion is accomplished directly in the pixels themselves and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-6), on the other hand, the photon detection principle is different. The light sensing diode is biased slightly above its breakdown point and when an incident photon generates an electron or hole, this carrier initiates an avalanche breakdown with additional carriers being generated. The process needs to be stopped (quenched) by lowering the diode bias below its breakdown point. This is called the Geiger mode of SPAD operation. The single photon can thus generate many carriers that are then easily detectable forming pulses coming from the SPAD pixels. This concept can be used in two ways. First, the arriving photons may simply be counted (e.g., in low light level applications). Second, the SPAD pixels may be used to measure photon time-of-flight (ToF), which can be used to obtain a 3-dimensional image of the scene.

Therefore, for maximum functionality of the image sensor, SPAD pixels that are back side illuminated in a single sensor array may be used for both the low light level photon counting function and the ToF detection, thereby generating signals that can be used to reconstruct a high resolution 3-dimensional image of the scene.

The SPAD pixels may be used for the detection of single photons impinging on the back side of the image sensor. The low light level detected photons may be counted by an analog counter to form the light intensity signal as a corresponding pixel voltage. The ToF signal may be obtained by also converting the time of photon flight to a voltage. Both of these voltages may be stored on pixel capacitors and may later be scanned in a row-by-row fashion. This concept thus allows building high performance image sensor arrays with small size pixels and with low power consumption.

To further improve performance of the imaging sensor, the imaging sensor with SPAD pixels may be implemented using stacked chips. For example, the photon sensing SPADs with some simple supporting circuits may be formed using silicon on insulator (SOI) technology on a first (top) light sensing chip. Most of the remaining pixel circuits may be formed on an underlying ASIC chip that is bonded to the light sensing chip with electrical interconnections at every pixel. This type of chip-to-chip connection is known as hybrid bonding.

Figure 1:
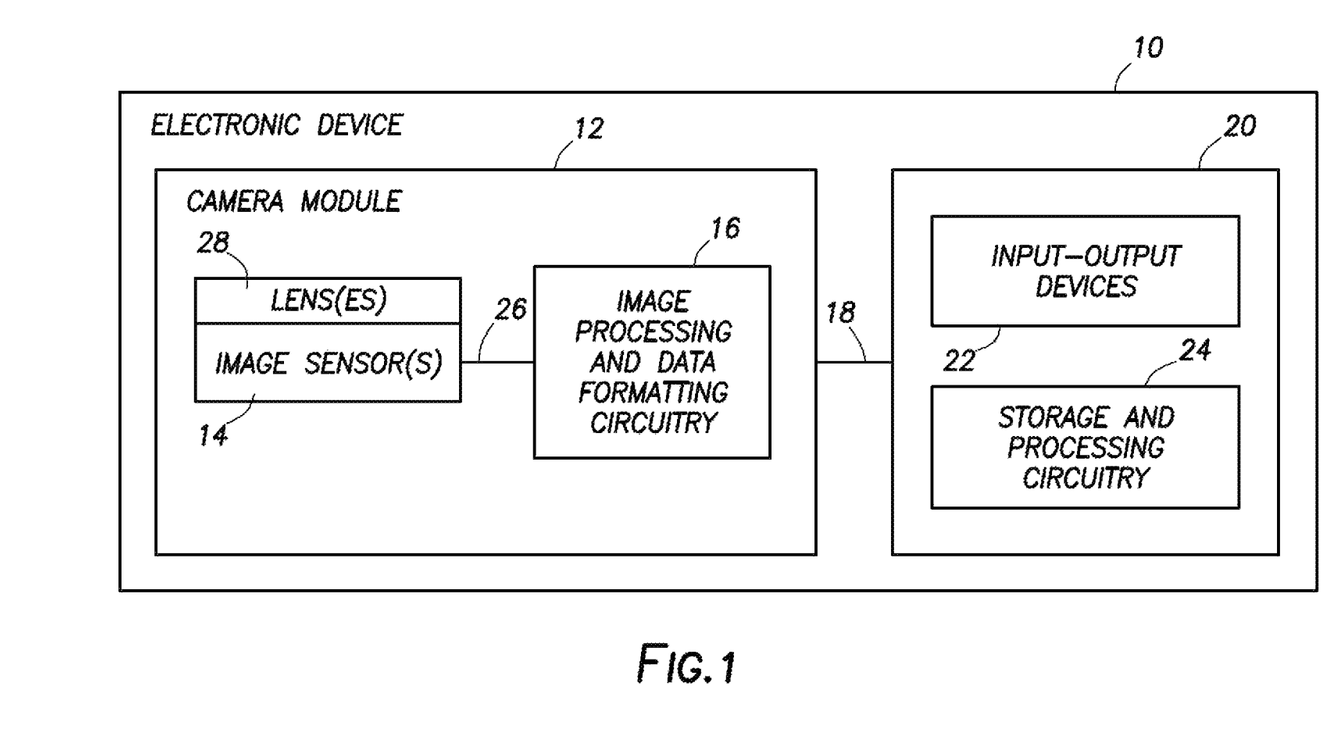
FIG. 1 is a schematic diagram of an illustrative electronic device with an image sensor in accordance with an embodiment.

An electronic device with a digital camera module and an image sensor is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) that convert the light into analog signals that are later converted to digital data. Image sensors may have any number of pixels (e.g., hundreds, thousands, millions, or more). A typical image sensor may, for example, have millions of pixels (e.g., megapixels). As examples, image sensor 14 may include bias circuitry signal buffering circuits (e.g., source follower and load circuits), sample and hold circuitry, correlated double sampling (CDS) circuitry, amplifier circuitry, analog-to-digital (ADC) converter circuitry, data output circuitry, memory (e.g., data buffering circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit chip. The use of a single integrated circuit chip to implement camera sensor 14 and image processing and data formatting circuitry 16 can help to reduce costs. This is, however, merely illustrative. If desired, camera sensor 14 and image processing and data formatting circuitry 16 may be implemented using separate integrated circuit chips.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Input-output devices 22 may also include light sources such as light-emitting diodes or lasers that may be used in combination with image sensor 14 to obtain time-of-flight depth sensing information. Input-output devices 22 may include, for example, a light source that emits visible or infrared light.

Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application-specific integrated circuits, or other processing circuits.

Figure 2:
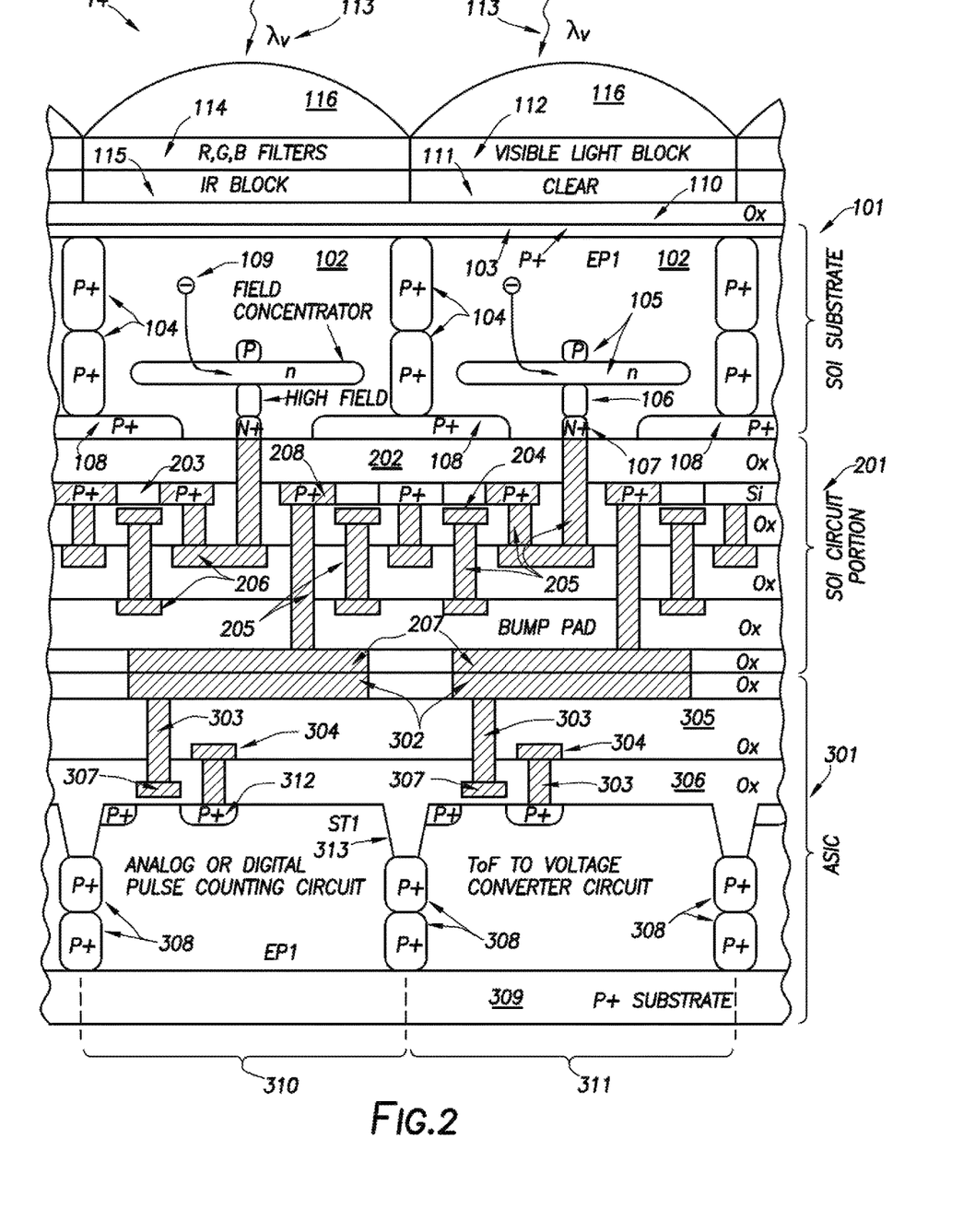
FIG. 2 is a cross-sectional side view of an illustrative image sensor with a stacked top silicon on insulator (SOI) chip on top of an application-specific integrated circuit (ASIC) chip that shows the details of the SPAD pixel structure and the SOI fully depleted transistors in accordance with an embodiment.

An illustrative image sensor such as image sensor 14 in FIG. 1 is shown in FIG. 2. FIG. 2 shows a simplified cross-sectional side view of the image sensor.

As shown in FIG. 2, image sensor 14 may be implemented using multiple substrate layers. The substrate layers may be layers of semiconductor material such as silicon. The substrate layers may also be silicon on insulator (SOI) substrates. SOI substrates may use silicon layers and insulating layers to reduce parasitic capacitance and improve performance. The substrate layers may sometimes be referred to as wafers or chips. The substrate layers may be connected using conductive interconnect layers (sometimes referred to as bump bonds, bump pads, or hybrid bonds).

As shown in FIG. 2, image sensor 14 may include stacked chips. Image sensor 14 may include a SOI chip that is hybrid bonded to an underlying ASIC chip. In FIG. 2, image sensor 14 includes a SOI substrate 101, a SOI circuit section 201, and an application-specific integrated circuit (ASIC) chip section 301. The SOI substrate section 101 may include a silicon epitaxial layer 102 that has a P+ doped region 103 deposited at the back side surface interface (facing the light illumination flow) to prevent generation of excessive dark current. The pixels may be isolated from each other by isolation regions such as P+ doped regions 104. Other types of isolation regions may be used if desired.

In order to form the single-photon avalanche diode (SPAD), the SOI substrate 101 may include a field concentrator formed by implants 105 that result in a high field occurring in the region 106 under the N+ contact junction 107. This example of an arrangement for the high field region for a SPAD is merely illustrative, and other arrangements may be used to form the high field region if desired. In this embodiment, it may be desirable that the capacitance of the N+ node 107 is kept at a minimum. The remainder of the front interface surface of the SOI substrate section may be covered by the P+ doped regions 108, again to minimize the interface generated dark current. The back side of this section may be covered by oxide layer 110 (OX) and various filters.

Filter 111 may be clear and may be covered by a visible light blocking filter 112. Filter 115 may block infrared (IR) light and may be covered by red (R), green (G), or blue (B) color filters. The visible light blocking filter 112 may block more than 90% of incident visible light. The visible light blocking filter may transmit the majority of light in other wavelengths. Clear filter 111 may not block any incident light. As clear filter 111 covers a pixel that may be intended to measure infrared light, clear filter 111 may transmit more than 90% of incident infrared light. Infrared blocking filter 115 may block more than 90% of infrared light while transmitting the majority of light at other wavelengths (e.g., visible light). The red color filter may transmit more than 90% of red light, the green color filter may transmit more than 90% of green light, and the blue color filter may transmit more than 90% of blue light. In general, each filter may have any desired transmission characteristics.

The filters may be arranged in repeating 2×2 subarrays with one red pixel, one green pixel, one blue pixel, and one infrared pixel arranged in a square. In the subarray of 4 pixels, one pixel may allow near infrared light to reach the SPAD device. This pixel may therefore be used for the time-of-flight (ToF) measurement while the others may be pulse counting color sensing pixels. Each pixel may also have a microlens 116 deposited over the filters to provide increased quantum efficiency (QE).

The light, consisting of individual photons 113, may be focused on the sensitive portions of the pixels and may generate electrons 109. The electrons are then driven by the field concentrator 105 into the region 106 that has high field intensity. This may cause impact ionization and generation of multiple additional electrons when the N+ region 107 is properly biased. In the SOI substrate, all the P+ doped regions (103, 104 and 108) may be biased by a negative bias (e.g., −10V) provided by a contact.

The SOI circuit section 201 of the image sensor may include a fully depleted silicon layer 203 deposited over the oxide layers 202 (OX) with the P+ or N+ doped regions 208 under the contacts depending on the type of SOI transistor used. The transistor gates are the regions 204 and the contact vias are the regions 205. The fully depleted transistors used in these pixels help achieve high speeds of operation and low parasitic capacitances. It is also important to use a thicker gate oxide in these transistors to help minimize the node capacitances. The metal wirings in this section of the pixel are the regions 206 with bump pad 207 (sometimes referred to as an interconnect layer) that is connected to underlying ASIC chip 301.

The ASIC section 301 of the image sensor may include pulse counting pixel circuits 310 and the time-of-flight (ToF) to voltage converter pixel circuits 311 built in the p-type doped region deposited over the P+ type doped substrate 309. The pulse counting pixel circuits 310 may be either analog pulse counting pixel circuits or digital pulse counting pixel circuits. Each of these pixel circuits includes a bump pad 302 deposited over the oxide layer 305, via connections 303 to contact regions, and the metallization wiring 304 deposited over the oxide layer 306. The junctions 312 are either P+ type doped or N+ type doped regions depending on the type of transistor used. All the transistors in image sensor 14 may have polysilicon gates (307 and 204). The pixel circuits in ASIC section 301 may be isolated from each other by the shallow trench isolation (STI) regions 313 and by the P+ type doped regions 308. For simplicity, certain details of the circuit cross section are omitted from FIG. 2.

Figure 3:
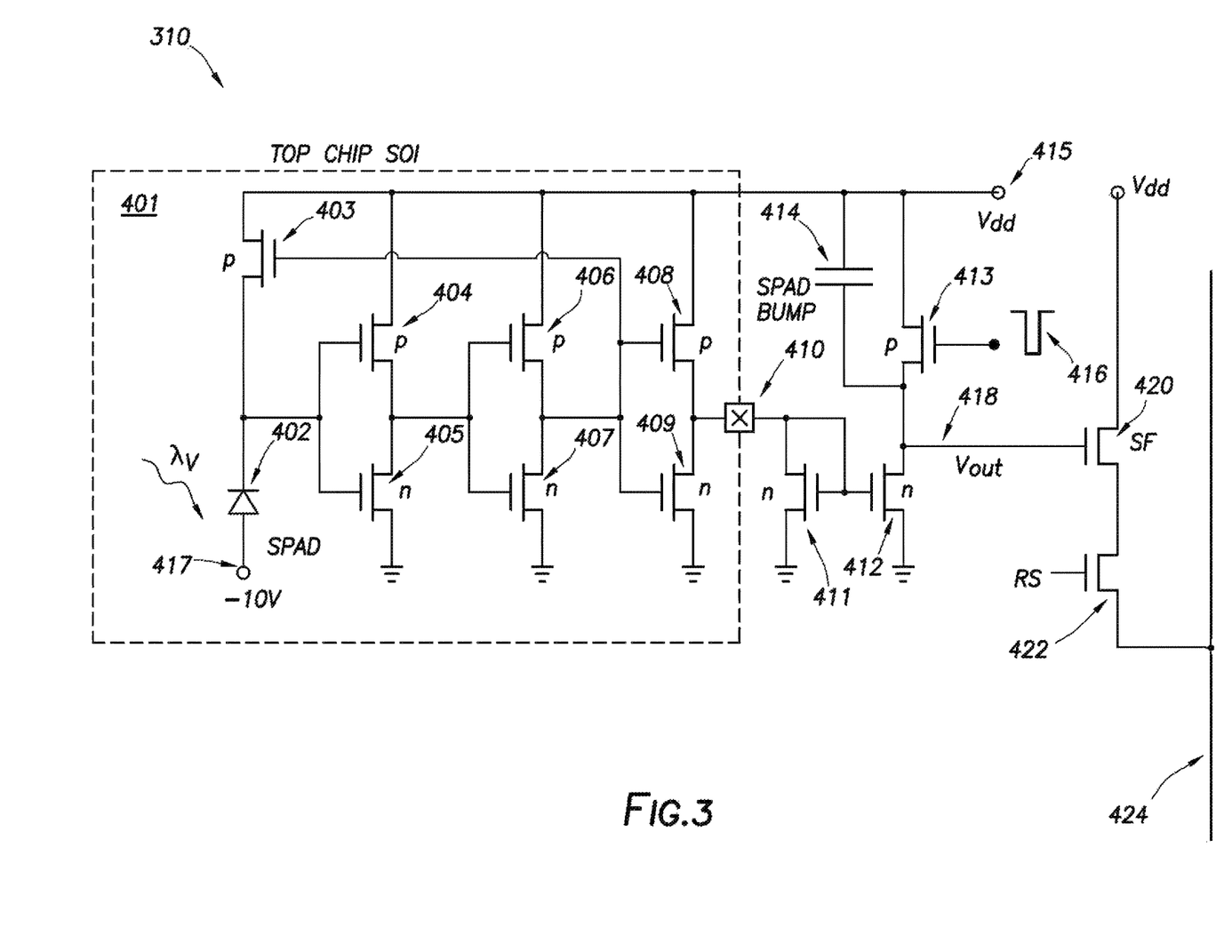
FIG. 3 is a simplified circuit diagram of an illustrative analog pulse counting circuit that may be used in an image sensor of the type shown in FIG. 2 in accordance with an embodiment.
Figure 4:
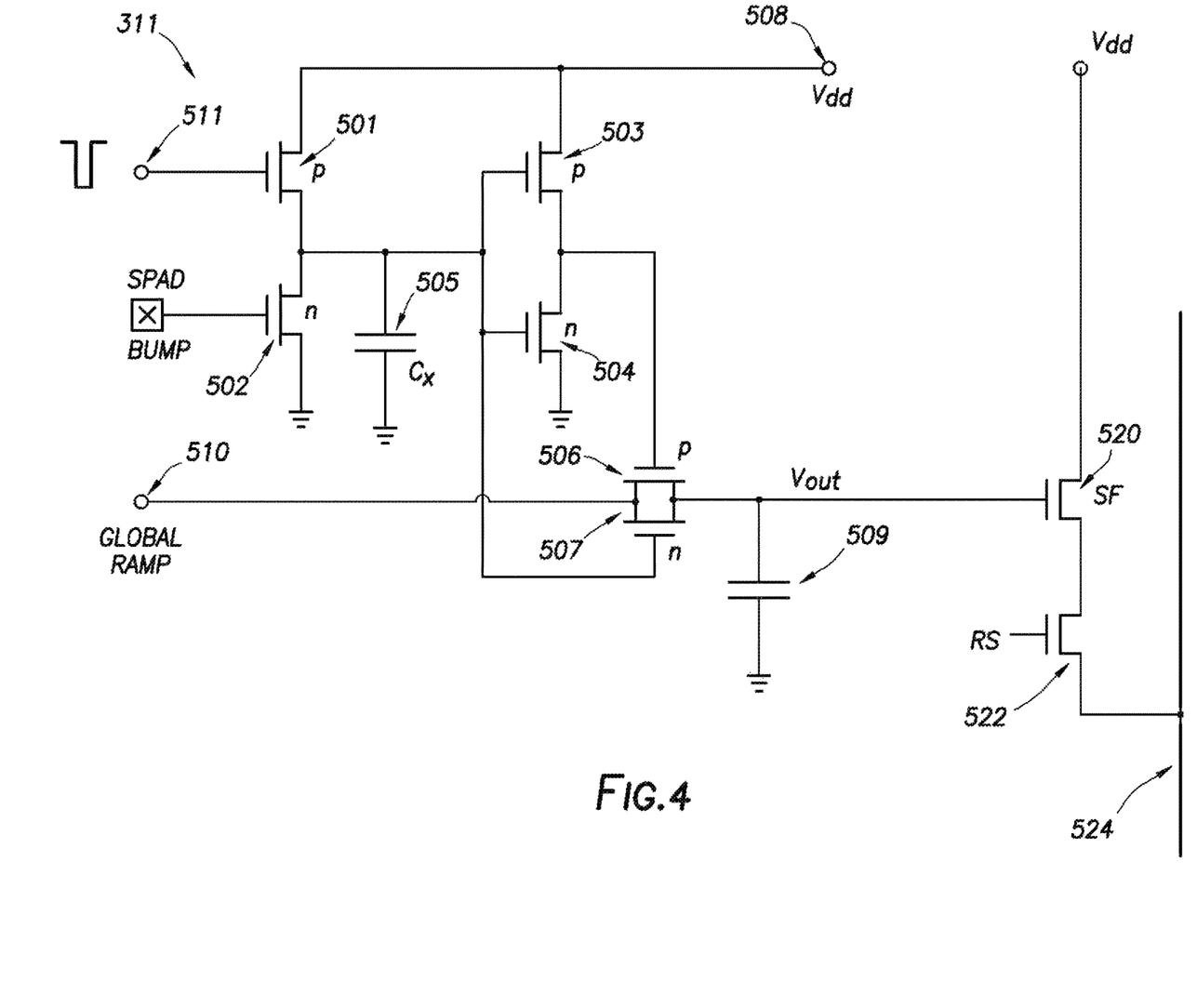
FIG. 4 is a simplified circuit diagram of an illustrative time-of-flight to voltage converter circuit that may be used in an image sensor of the type shown in FIG. 2 where the output voltage corresponds to the time-of-flight and is stored on a pixel capacitor in accordance with an embodiment.

Details of the illustrative signal processing circuits (i.e., analog or digital pulse counting circuit 310 and ToF to voltage converter circuit 311) are shown in FIGS. 3 and 4.

FIG. 3 shows a simplified circuit diagram of an illustrative analog SPAD pulse counting circuit (310). As shown in FIG. 3, analog pulse counting circuit 310 may include circuitry in the top chip (formed from SOI substrate 101 and SOI circuit portion 201) and circuitry in ASIC circuit 301. In FIG. 3, the circuitry in the top chip is shown in block 401. Analog SPAD pulse counting circuit 310 may include a single-photon avalanche diode (SPAD) 402. The SPAD diode 402 may generate a pulse in response to an incident photon that is buffered by two inverters formed by transistors 404, 405, 406, and 407. Transistors 405 and 407 may be n-type transistors whereas transistors 404 and 406 may be p-type transistors. The resulting pulse output may be fed to the gate of avalanche quenching transistor 403 and to the buffer circuit formed by transistors 408 and 409. Avalanche quenching transistor 403 may be a p-type transistor. Transistor 408 may be a p-type transistor whereas transistor 409 may be an n-type transistor.

Output from this buffer (formed by transistors 408 and 409) may drive the bump pad 410 that connects the top chip to the ASIC chip. Bump pad 410 may be formed from first and second layers (i.e., layers 207 and 302 in FIG. 2). The bias to the analog SPAD pulse counting circuit 310 may be provided by the drain bias line 415 (Vdd) and by the SPAD substrate bias node 417. The corresponding circuits of the ASIC chip may include a current source formed by the transistors 411 and 412 and the capacitor 414. The capacitor 414 may be reset by transistor 413 that has a reset pulse 416 supplied to its gate. The example of using transistor 413 to reset capacitor 414 is merely illustrative, and other reset arrangements may be used if desired. For example, an active reset scheme or a double reset may be used to minimize kTC reset noise generated by resetting this capacitor. It may also be possible to select the value of this capacitor such that the corresponding reset noise can be neglected.

When the SPAD pulses are detected, the resulting current pulses gradually charge the capacitor 414 and its bias voltage change is detected at the node 418. Node 418 may be coupled to a source follower transistor 420 (SF). A row select transistor 422 (RS) may be coupled between source follower transistor 420 and a column output line 424.

In another embodiment, the pulse counting circuit 310 may instead be implemented as a digital counter that may have more complex circuits and consume more power. Such circuits may provide the pulse count directly without kTC noise generation.

FIG. 4 shows the simplified circuit diagram of an illustrative ToF to voltage converter circuit 311. ToF to voltage converter circuit 311 may include a pass gate formed from transistors 506 and 507. Global ramp pulse 510 may be applied to the pass gate formed by transistors 506 and 507. The global ramp start may be coincidental with the scene illumination pulse (e.g., from an infrared light source). When the SPAD pulse is later detected, the detection corresponds to the reflected photon from the scene. That pulse is supplied to the gate of transistor 502, which causes a discharge of the capacitor 505 ($C_x$). This signal is inverted by an inverter formed by transistors 503 and 504 and both of these signals are supplied to the gates of the transistors 506 and 507 of the pass gate. This action opens up the pass gate and no more signal change supplied from the global ramp can be delivered to the capacitor 509. The voltage on this capacitor thus stays constant and the change from its initial value corresponds to the photon time-of-flight (ToF). The voltage on this capacitor may be connected through source follower transistor 520 (SF) and row select transistor 522 (RS) to the column line 524 and the array can be scanned in a row-by-row fashion.

The circuit may be reset by applying a pulse to the node 511, which is connected to the gate of the reset transistor 501. The reset pulse reconnects (closes) the pass gate and the capacitor 509 may again become connected to the global ramp circuit waiting for another SPAD pulse. The drain bias (Vdd) for this circuit may be provided at the node 508. The value of the capacitor 509 can be chosen such that kTC noise resulting from disconnecting it from the Global Ramp is negligible.

One advantage of using the ToF to voltage conversion circuit of FIG. 4 is that the global ramp slope can be changed, which corresponds to a range change of the distance measurement.

Figure 5:
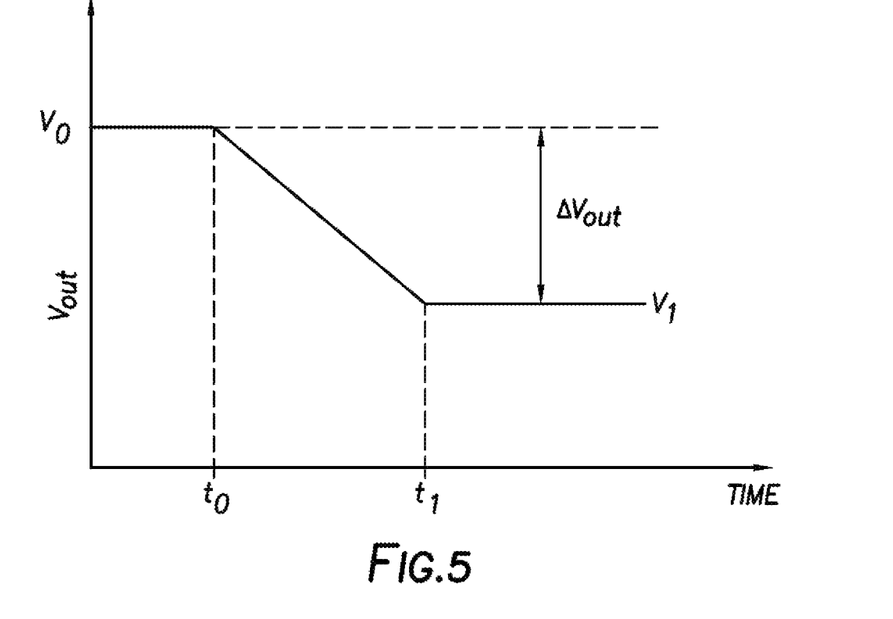
FIG. 5 is a timing diagram of an illustrative global ramp being used to measure photon time-of-flight in accordance with an embodiment.

FIG. 5 is a timing diagram of an illustrative global ramp being used to measure photon time-of-flight. As shown, at $t_0$ the global ramp may start. Also at $t_0$, light may be emitted from the light source for the time-of-flight detection system. The global ramp may cause $V_{OUT}$ to gradually decrease at a known rate. When the ToF to voltage converter circuit 311 receives the SPAD pulse, the detection corresponds to the reflected photon from the scene. In other words, light emitted from the light source reflects off of the scene and is detected (at $t_1$, for example). The SPAD pulse corresponding to the detection may then cause the voltage at capacitor 509 to stay constant as described above. Accordingly, $V_{OUT}$ stays constant once the photon is detected at $t_1$. The difference in $V_{OUT}$ ($\Delta V_{OUT}$) may then be used to determine the time-of-flight of the emitted light, which may then be used to determine the distance from the sensor to the detected object.

Figure 6:
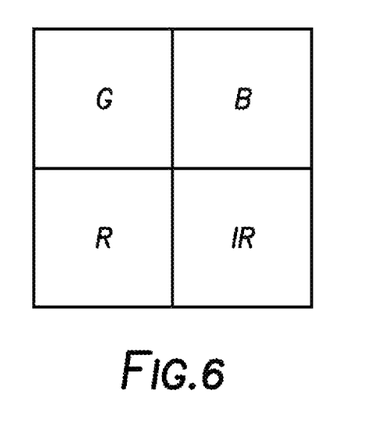
FIG. 6 is a top view of an illustrative color filter pattern that may be used to cover the pixels in accordance with an embodiment.

FIG. 6 shows an illustrative color filter pattern that may be used to cover the pixels. FIG. 6 shows color filter elements arranged in a repeating cell of two-by-two color filter elements, with a green color filter element and infrared color filter element diagonally opposite one another, and the other corners being red and blue. This pattern may be repeated across the entire image sensor array. In FIG. 6, red color filter elements are labeled "R", green color filter elements are labeled "G", blue color filter elements are labeled "B", and infrared color filter elements are labeled "IR". Each color filter element may cover a corresponding single-photon avalanche diode. The visible light color filters (i.e., the red color filter, green color filter, and blue color filter) may also cover a pulse counting circuit, whereas the infrared color filter element may also cover a time-of-flight to voltage converter circuit.

In connection with FIG. 6, an infrared color filter element is described. However, it should be understood that this example is merely illustrative. As shown in FIG. 2, the pixel used for obtaining time-of-flight information may include multiple filters (e.g., a visible light blocking filter 112 and a clear color filter 113 as in FIG. 2). A single infrared color filter (that passes infrared light but blocks light of other wavelengths) may also be used.

An infrared color filter may be used to cover the pixels that obtain time-of-flight information in embodiments where an infrared light source is used for the time-of-flight measurements. In general, pixels used to obtain time-of-flight information may be covered by filters that filter the specific wavelength of the light source used for the time-of-flight measurements.

In conclusion, an image sensor with 3-dimensional imaging capability may be based on photon counting using SPAD devices. The image sensor may be built in the stacked chip architecture, may be back side illuminated, and may use SOI technology for increased speed and sensitivity. The image sensor array may include two sets of pixels: one set that provides pulse counting for light intensity information and the other set that provides distance information based on ToF measurements.

In various embodiment, an image sensor may include a first substrate, a plurality of single-photon avalanche diodes in the first substrate, a plurality of conductive interconnects, and a second substrate. Each single-photon avalanche diode may have a corresponding conductive interconnect of the plurality of conductive interconnects that couples the first substrate to the second substrate. The image sensor may also include a pulse counting circuit in the second substrate configured to generate light level signals in response to signals from at least a first single-photon avalanche diode of the plurality of single-photon avalanche diodes and a time-of-flight to voltage converter circuit configured to generate a signal with time-of-flight information in response to signals from at least a second single-photon avalanche diode of the plurality of single-photon avalanche diodes.

The first substrate may include a silicon on insulator (SOI) chip with a silicon on insulator substrate portion and a silicon on insulator circuit portion. The silicon on insulator substrate portion may include a layer of epitaxial silicon and the silicon on insulator circuit portion may include a fully depleted silicon layer and an inverter circuit that drives a connection between the first and second substrates through a conductive interconnect of the plurality of conductive interconnects. Each single-photon avalanche diode of the plurality of single-photon avalanche diodes may be coupled to a respective avalanche quenching transistor and each single-photon avalanche diode of the plurality of single-photon avalanche diodes may not use field concentrator implants. Each single-photon avalanche diode of the plurality of single-photon avalanche diodes may be coupled to a respective avalanche quenching transistor and may include field concentrator implants. The first substrate may include a plurality of circuit transistors formed in a fully depleted silicon on insulator layer.

The pulse counting circuit may include a capacitor and a current source circuit, each conductive interconnect of the plurality of conductive interconnects may include an output bump on the first substrate and an input bump on the second substrate, the input bump of a first conductive interconnect may be connected to the current source circuit, and the current source circuit may supply current pulses to the capacitor that result in a voltage across the capacitor corresponding to a number of current pulses. The capacitor may be coupled to a source follower transistor and a row select transistor may be coupled between the source follower transistor and a column output line. The image sensor may also include a reset transistor connected across the capacitor. The capacitor may be reset by an active reset circuit. The pulse counting circuit may be a digital pulse counting circuit. The time-of-flight to voltage converter circuit may include a capacitor and a pass gate, a global ramp voltage pulse may discharge the capacitor through the pass gate, each conductive interconnect of the plurality of conductive interconnects may include an output bump on the first substrate and an input bump on the second substrate, and the input bump of a first conductive interconnect may be configured to provide a pulse from the at least second single-photon avalanche diode that disconnects the global ramp voltage pulse from the capacitor. The capacitor may be coupled to a source follower transistor and a row select transistor may be coupled between the source follower transistor and a column output line.

In various embodiments, an image sensor may include a first plurality of single-photon avalanche diodes, a second plurality of single-photon avalanche diodes, a plurality of pulse counting circuits, each of which is configured to generate light level signals in response to signals from a respective single-photon avalanche diode of the first plurality of single-photon avalanche diodes, and a plurality of time-of-flight to voltage converter circuits, each of which is configured to generate a signal with time-of-flight information in response to signals from a respective single-photon avalanche diode of the second plurality of single-photon avalanche diodes.

The first and second plurality of single-photon avalanche diodes may be formed in a silicon on insulator chip. Each pulse counting circuit may include a respective capacitor formed in an application-specific integrated circuit (ASIC) chip, each pulse counting circuit may include a respective current source circuit, the current source circuit of each pulse counting circuit may supply current pulses to the respective capacitor in response to pulses from a respective single-photon avalanche diode of the first plurality of single-photon avalanche diodes that result in a voltage across the capacitor corresponding to a number of current pulses. Each time-of-flight to voltage converter circuit may include a respective additional capacitor and a pass gate in the application-specific integrated circuit chip, a global ramp voltage pulse in each time-of-flight to voltage converter circuit may discharge the respective additional capacitor through the pass gate, and each time-of-flight to voltage converter circuit may be configured to receive a pulse from a respective single-photon avalanche diode of the second plurality of single-photon avalanche diodes that disconnects the global ramp voltage pulse from the respective additional capacitor. Each single-photon avalanche diode of the second plurality of single-photon avalanche diodes may be covered by a filter that blocks visible light and each single-photon avalanche diode of the first plurality of single-photon avalanche diodes may be covered by a color filter selected from the group consisting of: a blue color filter, a green color filter, and a red color filter.

In various embodiments, an image sensor may include a first substrate, a first single-photon avalanche diode formed in the first substrate, a second single-photon avalanche diode formed in the first substrate, a second substrate, an analog pulse counting circuit that receives signals from the first single-photon avalanche diode, and a time-of-flight to voltage converter circuit that receives signals from the second single-photon avalanche diode. At least a portion of the analog pulse counting circuit may be formed in the second substrate and at least a portion of the time-of-flight to voltage converter circuit may be formed in the second substrate.

The analog pulse counting circuit may be a first analog pulse counting circuit. The image sensor may also include a third single-photon avalanche diode formed in the first substrate, a fourth single-photon avalanche diode formed in the first substrate, a second analog pulse counting circuit that receives signals from the third single-photon avalanche diode, and a third analog pulse counting circuit that receives signals from the fourth single-photon avalanche diode. The first single-photon avalanche diode may be covered by a green color filter, the second single-photon avalanche diode may be covered by a filter that blocks visible light, the third single-photon avalanche diode may be covered by a blue color filter, and the fourth single-photon avalanche diode may be covered by a red color filter.

The foregoing is merely illustrative of the principles of this invention and various modifications can be made by those skilled in the art without departing from the scope and spirit of the invention.

What is claimed is:

1. An image sensor comprising:
   a substrate;
   a single-photon avalanche diode in the substrate; and
   a time-of-flight to voltage converter circuit that is coupled to the single-photon avalanche diode and that includes:
      a capacitor;
      a pass gate, wherein a global ramp pulse is configured to discharge the capacitor through the pass gate and wherein a pulse generated by the single-photon avalanche diode is configured to disconnect the global ramp pulse from the capacitor;
      an additional capacitor that is discharged in response to the pulse generated by the single-photon avalanche diode; and
      an inverter coupled to the additional capacitor, wherein an output of the inverter is supplied to the pass gate.

2. The image sensor defined in claim 1, wherein the inverter is configured to supply signals to the pass gate to disconnect the global ramp pulse from the capacitor in response to the additional capacitor being discharged in response to the pulse generated by the single-photon avalanche diode.

3. The image sensor defined in claim 1, wherein the time-of-flight to voltage converter circuit comprises a source follower transistor and wherein the capacitor is coupled to a gate of the source follower transistor.

4. The image sensor defined in claim 3, wherein the time-of-flight to voltage converter circuit further comprises a row select transistor and a column output line and wherein the row select transistor is interposed between the source follower transistor and the column output line.

5. The image sensor defined in claim 1, wherein the global ramp pulse is configured to start at the same time as a scene illumination pulse.

* * * * *